(12) United States Patent
Perzlmaier et al.

(10) Patent No.: US 11,894,493 B2
(45) Date of Patent: Feb. 6, 2024

(54) RADIATION-EMITTING SEMICONDUCTOR CHIP AND A METHOD FOR PRODUCING A RADIATION-EMITTING SEMICONDUCTOR CHIP

(71) Applicant: OSRAM OLED GmbH, Regensburg (DE)

(72) Inventors: Korbinian Perzlmaier, Regensburg (DE); Stefan Illek, Donaustauf (DE)

(73) Assignee: OSRAM OLED GMBH, Regensburg (DE)

(*) Notice: Subject to any disclaimer, the term of this patent is extended or adjusted under 35 U.S.C. 154(b) by 174 days.

(21) Appl. No.: 16/964,219

(22) PCT Filed: Jan. 15, 2019

(86) PCT No.: PCT/EP2019/050967
§ 371 (c)(1),
(2) Date: Jul. 23, 2020

(87) PCT Pub. No.: WO2019/145193
PCT Pub. Date: Aug. 1, 2019

(65) Prior Publication Data
US 2021/0043806 A1 Feb. 11, 2021

(30) Foreign Application Priority Data
Jan. 23, 2018 (DE) .......................... 102018101389.2

(51) Int. Cl.
*H01L 33/46* (2010.01)
*H01L 33/56* (2010.01)
*H01L 33/48* (2010.01)

(52) U.S. Cl.
CPC ............ *H01L 33/465* (2013.01); *H01L 33/56* (2013.01); *H01L 33/486* (2013.01)

(58) Field of Classification Search
CPC combination set(s) only.
See application file for complete search history.

(56) References Cited

U.S. PATENT DOCUMENTS

2004/0238837 A1* 12/2004 Jacob ..................... H01L 33/46
257/745
2008/0042145 A1* 2/2008 Hagleitner ............. H01L 33/40
257/E33.068

(Continued)

FOREIGN PATENT DOCUMENTS

| DE | 102008035900 A1 | 11/2009 |
|---|---|---|
| DE | 102014106882 A1 | 11/2015 |
| WO | 2010020213 A1 | 2/2010 |

OTHER PUBLICATIONS

Gierl, C. et al., Surface micromachined tunable 1.55—VCSEL with 102 nm continuous single-mode tuning, Aug. 18, 2011, pp. 17336-17343, vol. 19, No. 18, Optics Express.

(Continued)

*Primary Examiner* — Mark W Tornow
*Assistant Examiner* — Priya M Rampersaud
(74) *Attorney, Agent, or Firm* — VIERING, JENTSCHURA & PARTNER mbB

(57) ABSTRACT

A radiation-emitting semiconductor chip may include a semiconductor body, a reflector, at least one cavity, and a seal. The semiconductor body may include an active region configured to generate electronic radiation. The reflector may be configured to reflect a portion of the electromagnetic radiation. The cavity may be filled with a material having a refractive index not exceeding 1.1. The seal may be impermeable to the material. The cavity may be arranged between the reflector and the semiconductor body, and the seal may cover the underside of the reflector.

19 Claims, 6 Drawing Sheets

(56) References Cited

U.S. PATENT DOCUMENTS

| | | | |
|---|---|---|---|
| 2008/0179611 A1* | 7/2008 | Chitnis | H01L 33/62 |
| | | | 257/E33.061 |
| 2011/0114988 A1* | 5/2011 | Sabathil | H01L 33/642 |
| | | | 257/E33.066 |
| 2011/0164644 A1* | 7/2011 | Grolier | H01L 33/405 |
| | | | 257/E31.127 |
| 2013/0087823 A1* | 4/2013 | Tsai | H01L 33/48 |
| | | | 257/98 |
| 2014/0319558 A1* | 10/2014 | Chen | H01L 33/10 |
| | | | 257/94 |
| 2014/0367693 A1 | 12/2014 | Peng et al. | |
| 2015/0155442 A1* | 6/2015 | Chien | H01L 33/405 |
| | | | 257/98 |
| 2015/0243729 A1* | 8/2015 | Pavageau | H01G 5/16 |
| | | | 257/532 |
| 2015/0287886 A1* | 10/2015 | Huang | H01L 33/38 |
| | | | 257/98 |
| 2016/0163923 A1* | 6/2016 | Kuo | H01L 33/145 |
| | | | 257/98 |
| 2017/0148959 A1 | 5/2017 | Haiberger | |
| 2017/0279009 A1 | 9/2017 | Hong et al. | |
| 2017/0309786 A1* | 10/2017 | Meng | H01L 33/22 |
| 2019/0386179 A1* | 12/2019 | Moriyasu | H01L 33/40 |

OTHER PUBLICATIONS

Office Action issued in the German Patent Application No. 102018101389.2, dated Nov. 8, 2018, 10 pages (for reference purposes only).

International Search Report issued in the International Patent Application No. PCT/EP2019/050967, dated Mar. 22, 2019, 14 pages (for reference purposes only).

* cited by examiner

RADIATION-EMITTING SEMICONDUCTOR CHIP AND A METHOD FOR PRODUCING A RADIATION-EMITTING SEMICONDUCTOR CHIP

CROSS-REFERENCE TO RELATED APPLICATIONS

The present application is a national stage entry according to 35 U.S.C. § 371 of PCT application No.: PCT/EP2019/050967 filed on Jan. 15, 2019; which claims priority to German Patent Application Serial No.: 10 2018 101 389.2 filed on Jan. 23, 2018; all of which are incorporated herein by reference in their entirety and for all purposes.

TECHNICAL FIELD

A radiation-emitting semiconductor chip is specified. In addition, a method for producing a radiation-emitting semiconductor chip is specified.

BACKGROUND

An object to be achieved is to specify a radiation-emitting semiconductor chip which has improved efficiency. A further object to be achieved is to specify a method which can be used to produce such a radiation-emitting semiconductor chip.

SUMMARY

A radiation-emitting semiconductor chip is specified. For example, in operation the radiation-emitting semiconductor chip emits electromagnetic radiation, in particular visible light. The radiation-emitting semiconductor chip is, for example, a light-emitting diode chip, abbreviated to LED chip, or a surface-emitting laser diode chip (vertical-cavity surface-emitting laser, or VCSEL).

According to at least one embodiment, the radiation-emitting semiconductor chip comprises a semiconductor body comprising an active region designed to generate electromagnetic radiation. The semiconductor body is, for example, an epitaxially grown semiconductor structure. The semiconductor body can be based on a III-V compound semiconductor material. The active region can comprise a quantum well structure or a multiple quantum well structure.

According to at least one embodiment, the radiation-emitting semiconductor chip comprises a reflector designed to reflect a portion of the electromagnetic radiation. For example, the reflector is a metallic reflector. This means that the reflector is made of or contains a metal. For example, the reflector is electrically conductive and reflects a high proportion of the electromagnetic radiation generated in the active region. For example, the reflector contains silver, aluminum, rhodium, nickel, copper or gold, or consists of silver, aluminum, rhodium, nickel, copper or gold.

It is also possible that the reflector is a Bragg mirror consisting of alternating layers of a highly refractive material and a weakly refractive material. For example, the reflector is designed to be electrically insulating.

In addition, the reflector can be a combination of a Bragg mirror and a metallic reflector. For example, the Bragg mirror is arranged between the active region and the metallic reflector.

The reflector has a reflectivity of at least 90% for electromagnetic radiation generated in the active region.

According to at least one embodiment, the radiation-emitting semiconductor chip comprises at least one cavity filled with a material having a refractive index not exceeding 1.1. The material with which the at least one cavity is filled can be a gas, for example. For example, the gas may be air or a process gas such as argon, krypton, xenon, nitrogen, oxygen, SF6 or H2O, and may contain traces of other gases. This means that the cavity contains a gas and may be filled with this gas. The gas may be present in the cavity under very low pressure, so that there is a negative pressure or a vacuum in the cavity, such as a coarse vacuum or a fine vacuum.

According to at least one embodiment, the radiation-emitting semiconductor chip comprises a seal that is impermeable to the material. For example, the seal is substantially impermeable to the material within the manufacturing tolerance. Substantially impermeable means here that small amounts of material could diffuse from the at least one cavity to the outside through the seal. The seal forms a seal for the material with which the at least one cavity is filled. In addition, the seal forms a seal for environmental materials, such as moisture or harmful gases that could damage the reflector. The seal is formed of a metal or a dielectric, for example. It is also possible that the seal can contain or consist of one of the following materials: silicon nitride, silicon oxide, aluminum oxide, titanium tungsten (nitride), nickel, titanium, bisbenzocyclobutene. The sealing material can be applied, for example, by sputtering, evaporation, chemical vapor phase deposition (CVD) or electroplating.

According to at least one embodiment, the at least one cavity is arranged between the reflector and the semiconductor body. The material with which the at least one cavity is filled is in direct contact, for example, with the semiconductor body and the reflector. For example, it is possible that only the gas is located between the semiconductor body and the reflector. No other material is then located between the semiconductor body and the reflector. The direct contact of the semiconductor body, which has a refractive index of at least 2, for example, with the material with which the at least one cavity is filled and the property that the refractive index of the material is no greater than 1.1, results in an abrupt change in the refractive index at the interface between the semiconductor body and the cavity. This abrupt change advantageously provides a particularly high reflectivity for emitted radiation that strikes the interface at a shallow angle.

According to at least one embodiment, the seal completely surrounds the at least one cavity laterally. The seal allows, for example, the material that fills the at least one cavity to be introduced between the reflector and the semiconductor body with a pressure that is lower than the normal external pressure. For example, the material is sealed in the at least one cavity at a pressure between 1 mbar and 1 bar.

It is also possible to seal the material in the at least one cavity with a positive pressure. A material introduced with a positive pressure improves the thermal properties of the material in the at least one cavity. This means that in this case, the heat dissipation through the material in the at least one cavity is further improved. In particular, pressure ranges between 1 bar and 5 bar are conceivable.

According to at least one embodiment, the seal covers one side face of the reflector, at least in some places. "At least in some places" means, for example, that the seal covers the side face of the reflector in some places or completely. A side face of the reflector is an outer surface of the reflector, which connects a covering surface of the reflector to a base surface of the reflector. The seal on the side face of the reflector thus protects the reflector against chemical damage, for example.

The seal also protects the reflector against mechanical damage during further processing steps. The seal can be arranged on all side faces of the reflector.

In at least one embodiment, the radiation-emitting semiconductor chip comprises an active region designed to generate electromagnetic radiation, a reflector designed to reflect a portion of electromagnetic radiation, at least one cavity filled with a material having a refractive index not exceeding 1.1, and a seal which is impermeable to the material.

The at least one cavity is arranged between the reflector and the semiconductor body. The seal completely surrounds the at least one cavity laterally, and the seal covers one side face of the reflector, at least in some places.

The radiation-emitting semiconductor chip described here now makes use, among other things, of the idea that gases that have a lower refractive index than, for example, dielectric solids are used as reflectors. This increases the total reflection of the radiation emitted by an LED at the reflector. This in turn increases the light output of the LED via an emission side located opposite the reflector.

At present, the light output of radiation-emitting semiconductor chips, such as LEDs, is increased by reflective mirrors made of a metal, for example. In addition, the reflectivity can be increased by arranging a dielectric solid material or a transparent conductive oxide (TCO) between the metallic mirror and the semiconductor body. The additional abrupt change in the refractive index promotes the total reflection and thus increases the light output. Here, the lower the refractive index of the dielectric material, the higher the total reflection.

One of the ideas underlying the radiation-emitting semiconductor chip described here is to replace the dielectric by a gas which has a particularly low refractive index. At the interface of the gas and, for example, a radiation-emitting semiconductor, an increased refractive index change therefore occurs. This advantageously achieves a particularly high reflectivity for emitted radiation that strikes the interface at a shallow angle. Electromagnetic radiation that is incident at steep angles is reflected by the reflector.

For example, the gas is trapped in cavities and sealed with a seal. This seal can also be used as protection for the mirror layer used.

According to at least one embodiment, a supporting layer is arranged on an underside of the reflector facing away from the semiconductor body. The supporting layer then forms, for example, the mechanically supporting component of the radiation-emitting semiconductor chip. For example, the supporting layer contains or consists of nickel, copper, titanium tungsten (nitride), titanium, platinum, tungsten, or a thick reflective film. For example, the reflective film is at least 200 nm thick. The reflective film is made of gold, for example.

One side face of the supporting layer is an outer surface of the supporting layer, which connects a covering surface of the reflector to a base surface of the supporting layer.

For example, the support layer can terminate flush with the sides of the reflector or protrude beyond the sides thereof.

In addition, the supporting layer can be made of the same materials as the reflector, for example.

According to at least one embodiment, the seal covers the base surface of the reflector on the underside of the reflector on the side of the reflector facing away from the semiconductor body. For example, the seal is in direct and immediate contact with the reflector on its underside. The seal on the underside of the reflector thus protects the reflector against chemical and mechanical damage, for example.

According to at least one embodiment, the supporting layer is arranged between the seal and the reflector. For example, the supporting layer is in direct and immediate contact with the reflector on the underside of the reflector. For example, the seal is in direct and immediate contact with the supporting layer on the underside of the supporting layer on the side of the supporting layer facing away from the reflector. This means that the seal protects the side faces of the reflector and the supporting layer, in addition to the underside of the supporting layer, from chemical and mechanical damage, for example.

For example, it is possible that the seal only covers the supporting layer on the underside of the supporting layer at some places. In other words, at some places the supporting layer is not covered by the seal. The seal is designed to be electrically insulating, for example. This means that at the points where the supporting layer is free of the seal, an electrical contact can be established to the supporting layer and the reflector, for example.

According to at least one embodiment, the seal terminates flush with the semiconductor body at the sides. That is, a side face of the semiconductor is aligned flush with a side face of the seal. A covering surface of the seal facing the semiconductor body is in direct and immediate contact with the base surface of the semiconductor body on the underside of the semiconductor body. In addition, for example, a base surface of the seal facing the upper side of the supporting layer is in direct and immediate contact with the covering surface of the supporting layer on the upper side of the supporting layer.

According to at least one embodiment, the seal terminates flush with the supporting layer at the sides. This means that a side face of the supporting layer is aligned flush with a side face of the seal. A compact design of the radiation-emitting semiconductor chip is thus advantageously achieved.

According to at least one embodiment, the seal completely surrounds the supporting layer, the reflector and the at least one cavity laterally. This means that the side faces of the supporting layer and of the reflector are completely covered by the seal. In addition, the at least one cavity is sealed by the seal. The lateral directions extend, for example, parallel to the main extension plane of the semiconductor body.

According to at least one embodiment, at least one support is arranged between the reflector and the semiconductor body. For example, the at least one support imparts a gap between the semiconductor body and the reflector, thus defining the vertical extension of the cavity. For example, the semiconductor body and the reflector are not in contact with each other. The semiconductor body and the reflector are therefore not directly in contact with each other at any point, but are separated from each other by the at least one support.

In addition, the at least one support provides a mechanical connection between the semiconductor body and the reflector. In other words, the reflector can be mechanically connected to the reflector, in particular via the at least one support.

For example, if a plurality of supports are arranged between the reflector and the semiconductor body, for example in the form of columns or posts, these may be arranged at grid points of a regular grid that extends along a lateral plane parallel to the main extension plane of the semiconductor body.

Alternatively, the at least one support can be designed as a closed track, for example. This means that the at least one support has a frame-shaped course, for example, in the lateral plane. The at least one support thus runs continuously and can enclose an area between the reflector and the semiconductor body, for example, in a frame-like manner. The term "frame-like" is not to be understood as limiting with regard to the shape and course of the at least one support. For example, the at least one support may have a rectangular, a polygonal, a round or an oval shape.

The at least one support, which is designed as a track, for example, can have discontinuities. This means that in the lateral plane the at least one support has a frame-shaped course, for example, which is discontinuous in places. The discontinuity is then a part of the at least one cavity, which is free of the at least one support.

If the radiation-emitting semiconductor chip has more than one support, the supports can each have the same shape. Alternatively, the supports may be designed as columns or posts and may be closed or partially closed tracks.

In addition, it is possible for the semiconductor body and the reflector to be in direct contact at some points. For example, in a first region the reflector and the semiconductor body are separated from each other at some points by the at least one support, and in a second region they are in direct contact with each other at some points, for example. For example, in the second region the reflector penetrates the at least one cavity completely as far as the semiconductor body.

For example, in the second region the reflector is designed as a closed track and can have discontinuities. This means that in the second region the reflector can have a frame-like course in the lateral plane, for example, which is discontinuous at some points. The discontinuity is then, for example, a part of the at least one cavity that is free of the reflector.

According to at least one embodiment, the at least one support forms an electrically conductive and mechanical connection between the reflector and the semiconductor body. The at least one support, for example, produces the mechanical connection between the reflector and the semiconductor body. This means that the reflector and the semiconductor body are mechanically connected to each other via the at least one support. The at least one support advantageously imparts the mechanical stability of the radiation-emitting semiconductor chip. In addition, the at least one support produces an electrically conductive connection between the reflector and the semiconductor body. This means that the reflector and the semiconductor body are connected to each other in an electrically conductive manner via the at least one support. Advantageously, the semiconductor body can be energized using the at least one support.

According to at least one embodiment, the at least one support is in direct contact with the reflector and the semiconductor body. The at least one support can be directly and immediately adjacent to the semiconductor body and directly and immediately adjacent to the reflector. This means that the at least one support can be positioned in direct and immediate contact with the semiconductor body and in direct and immediate contact with the reflector.

According to at least one embodiment, an intermediate layer is arranged between the semiconductor body and the at least one support and the at least one cavity. For example, the intermediate layer is in direct and immediate contact with the at least one support and the semiconductor body. In addition, the intermediate layer can also be arranged between the seal and/or the supporting layer and/or the reflector in the second region. The intermediate layer is permeable to the electromagnetic radiation generated in the semiconductor body.

For example, the intermediate layer is formed of a transparent conductive oxide (TCO). The TCO has, in particular, has a thickness of 50 nm or less, such as a maximum of 20 nm. In addition, the intermediate layer may be formed of a native oxide and, for example, have a thickness of 10 nm or less, such as 5 nm or less. Advantageously, the intermediate layer energizes the semiconductor body homogeneously.

According to at least one embodiment, the at least one support contains the same material as the reflector. This means the at least one support and the reflector can each contain at least one common metal. For example, both the at least one support and the reflector contain silver, aluminum or gold. In addition, the at least one support and the reflector can be made of the same material, for example. For example, the at least one support and the reflector consist of aluminum, silver or gold.

In addition, the at least one support can also be formed by a transparent conductive oxide (TCO), for example.

In addition, a method for producing a radiation-emitting semiconductor chip is specified. The method is suitable for producing a radiation-emitting semiconductor chip described here. This means that a radiation-emitting semiconductor chip described here either can be produced using the described method or is produced using the described method. All the features disclosed in connection with the radiation-emitting semiconductor chip are therefore also disclosed in connection with the method and vice versa.

In accordance with at least one embodiment the method comprises the step of providing a semiconductor wafer comprising a plurality of semiconductor bodies. The semiconductor bodies each comprise an active region designed to generate electromagnetic radiation. The semiconductor body is, for example, an epitaxially grown semiconductor wafer. In addition, the semiconductor wafer may contain a carrier on which a plurality of semiconductor bodies are mounted.

In accordance with at least one embodiment the method comprises the step of applying a sacrificial layer on an underside of the semiconductor wafer. For example, the underside of the semiconductor wafer is a side on which the plurality of semiconductor bodies are mounted and has a p-doped semiconductor layer, for example. The sacrificial layer is made of silicon dioxide, silicon or germanium, for example. The sacrificial layer is produced on the underside of the semiconductor wafer by evaporation, sputtering, CVD, PECVD, for example.

According to at least one embodiment, the method comprises the step of generating openings in the sacrificial layer, exposing the semiconductor wafer in the area of the opening. The openings in the sacrificial layer can be generated, for example, by material abrasion of the sacrificial layer. The material abrasion can be carried out, for example, by etching. The openings completely penetrate the sacrificial layer. This means that the sacrificial layer is then completely removed and punctured by the opening. A base surface on the underside of the semiconductor wafer then forms a base surface of the opening.

According to at least one embodiment, the method comprises the step of producing supports by filling the openings with a support material. This means that the support material is filled into the openings. The base surface of the openings and the side faces of the openings are completely covered by the support material. The support material is in direct and immediate contact, for example, with the underside of the semiconductor wafer and the side faces of the openings in the sacrificial layer. For example, the openings are filled up to an underside of the sacrificial layer. The support material then terminates flush with the underside of the sacrificial layer, for example.

It is also possible that the support material extends past the underside of the sacrificial layer. Furthermore, it is possible that the support material on the top of the sacrificial layer can extend past the openings in lateral directions.

The support material, for example, is electrically conductive and contains silver, aluminum or gold, for example.

According to at least one embodiment, the method comprises the step of applying a reflector layer to an outer side of the sacrificial layer facing away from the semiconductor wafer, wherein the reflector layer covers the supports. For example, the reflector layer can consist of or contain the same material as the support material.

The reflector layer can be applied by evaporation, for example. When a mask is used, in particular a shadow mask, a large number of cutouts is created in the reflector layer, for example, when applying the reflector layer. The reflector layer is in direct and immediate contact with the underside of the sacrificial layer and with the supports. A base surface on the underside of the sacrificial layer then forms a base surface of the cutouts. The side faces of the cutouts are formed by the reflector layer.

Alternatively, after applying the reflector layer, a plurality of openings can be created in the reflector layer. The openings in the reflector layer can be generated, for example, by material abrasion of the reflector layer. The material abrasion can be carried out, for example, by etching. The openings in this case completely penetrate the reflector layer. This means that the reflector layer is then completely removed and punctured by the opening. A base surface on the underside of the sacrificial layer then forms a base surface of the opening.

In accordance with at least one embodiment the method comprises the step of removing the sacrificial layer. The sacrificial layer, which consists or is formed of silicon dioxide, for example, can be removed by an etching process using gaseous hydrogen fluoride, for example. Due to the distance that the supports provide between the semiconductor wafer and the reflector layer, at least one cavity is formed between the semiconductor wafer and the reflector layer. This means that the semiconductor wafer and the reflector layer are spaced apart from each other. In other words, the space that is not filled by the supports is the at least one cavity between the semiconductor wafer and the reflector layer.

In accordance with at least one embodiment the method comprises the step of separating a wafer to form a plurality of semiconductor chips. The semiconductor wafer is separated into radiation-emitting semiconductor chips by making vertical cuts through the semiconductor wafer. After the separation, a portion of the reflector layer on each of the separated radiation-emitting semiconductor chips forms a reflector for the respective radiation-emitting semiconductor chip.

According to at least one embodiment, the method comprises the step of applying a supporting layer on a side of the reflector layer facing away from the semiconductor wafer after applying the reflector layer. The supporting layer in this case is in direct and immediate contact with the reflector layer. For example, the supporting layer is flush with the reflector layer at the sides.

According to at least one embodiment, the method comprises the step of applying a sealing layer on an outer side of the reflector layer facing away from the semiconductor wafer after applying the supporting layer. For example, the sealing layer is therefore in direct and immediate contact with the underside of the semiconductor wafer and the underside of the supporting layer. In addition, the sealing layer covers the side faces of the supporting layer and the reflector layer and seals the at least one cavity. The sealing layer completely surrounds the at least one cavity laterally. The sealing layer forms a seal for the material with which the at least one cavity is filled. The sealing layer is formed of a metal or a dielectric, for example.

In another embodiment the sealing layer is applied to the underside of the reflector layer and to the underside of the semiconductor layer before applying the support layer, for example.

In accordance with at least one embodiment the method comprises the step of separation through the sealing layer and the semiconductor wafer. This means that the semiconductor wafer is separated into radiation-emitting semiconductor chips by vertical cuts through the sealing layer and the semiconductor wafer. The sealing layer in this case covers the reflector layer and the support layer, if present, in addition to the at least one cavity of the separated radiation-emitting semiconductor chips. After the separation, a portion of the reflector layer on each of the separated radiation-emitting semiconductor chips forms a reflector. In addition, a portion of the sealing layer on each of the separated radiation-emitting semiconductor chips forms a seal for the respective radiation-emitting semiconductor chip.

BRIEF DESCRIPTION OF THE FIGURES

In the following, the radiation-emitting semiconductor chip described here and the method described here are explained in more detail in conjunction with non-limiting embodiments and the associated figures.

Identical, similar or equivalently functioning elements are labelled with the same reference signs in the figures. The figures and the relative proportions of the elements represented in the figures are not to be considered to be true to scale. Instead, individual elements may be shown exaggerated in size for ease of visualization and/or better understanding.

DESCRIPTION

Figure 1:
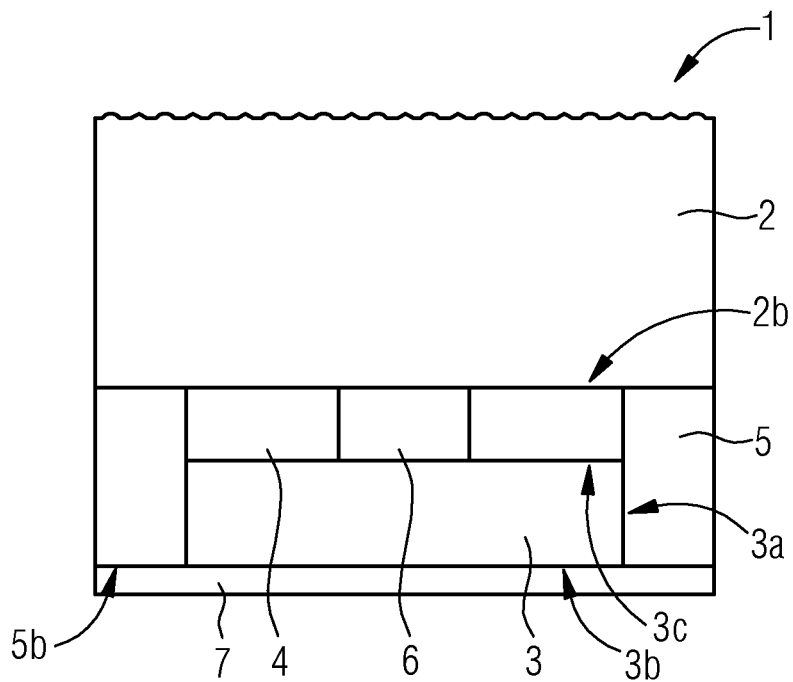
FIGS. 1, 2, 3A, 3B, 3C and 3D show schematic cross-sectional drawings of exemplary embodiments of a radiation-emitting semiconductor chip described here.

The schematic cross-sectional drawing of FIG. 1 shows an exemplary embodiment of a radiation-emitting semiconductor chip described here.

The radiation-emitting semiconductor chip 1 comprises a semiconductor body 2, for example. The semiconductor body 2 comprises an active region which is designed to generate electromagnetic radiation. The underside 2b of the semiconductor body 2 faces toward an upper side of the reflector 3c. For example, the reflector 3 consists of or contains silver, aluminum or gold.

The semiconductor body 2 and the reflector 3 are connected to each other mechanically and/or in an electrically conductive manner by means of at least one support 6, for example. The at least one support 6 creates a gap between the semiconductor body 2 and the reflector 3. Due to this gap, at least one cavity 4 is formed between the semiconductor body 2 and the reflector 3. The at least one cavity 4 is filled with air or another gas. A seal 5 completely surrounds the at least one cavity 4 laterally.

In addition, the seal 5 covers the side faces of the reflector 3a, for example completely. A base surface on the underside of the seal 5b terminates flush with a covering surface on the underside of the reflector 3b, for example in a planar manner. In addition, the seal 5 terminates flush with the semiconductor body 2 laterally. The seal 5, for example, is in direct and immediate contact with the semiconductor body 2 and the side faces of the reflector 3a. A supporting layer 7 is arranged on the underside of reflector 3b and the seal 5b. The supporting layer 7 then terminates flush with the side of the seal 5 and, for example, is in direct contact with the underside of the seal 5b and the reflector 3b.

Figure 2:
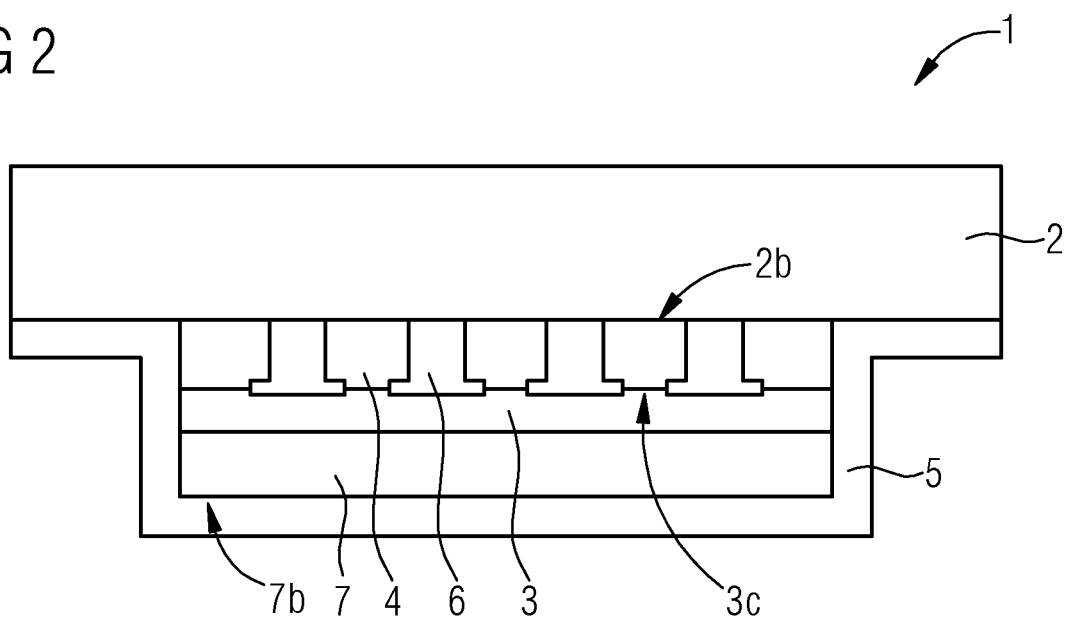

The schematic cross-sectional drawing of FIG. 2 shows a further exemplary embodiment of a radiation-emitting semiconductor chip 1 described here. The radiation-emitting semiconductor chip 1 comprises a semiconductor body 2, which comprises an active region, for example. The active region is designed for radiation generation, for example. The underside 2b of the semiconductor body 2 faces toward the upper side of the reflector 3c.

In this exemplary embodiment a plurality of supports 6 create a gap between the semiconductor body 2 and the reflector 3. Due to this gap, at least one cavity 4 is formed between the semiconductor body 2 and the reflector 3.

For example, the supports 6 can be designed as columns or posts. This creates exactly one cavity 4 between the semiconductor body 2 and the reflector 3. The supports 6, which are designed as columns or posts, for example, can be arranged at grid points of a regular grid, for example. Alternatively, the supports 6 may be implemented as a closed or non-closed track.

A supporting layer 7 is arranged on the underside of the reflector 3b. The supporting layer 7 then terminates flush with the sides of the reflector 3.

The semiconductor body 2 overhangs the reflector 3 and the supporting layer 7 laterally. A seal 5 is arranged on the underside of the semiconductor body 2b which overhangs the reflector 3 and the supporting layer 7. In addition, the seal completely surrounds the reflector 3 and the supporting layer 7 laterally and seals the at least one cavity 4.

In addition, the seal 5 is arranged on the underside of the supporting layer 7b. The seal 5 closes off the at least one cavity 4 and seals it. In this way, for example, a gas other than air can be introduced into the at least one cavity 4. The gas can also be introduced between the semiconductor body 2 and the reflector 3 at a pressure lower than the normal pressure.

The schematic cross-sectional drawings of FIGS. 3A to 3D show further exemplary embodiments of a radiation-emitting semiconductor chip 1 described here.

Figure 3A:
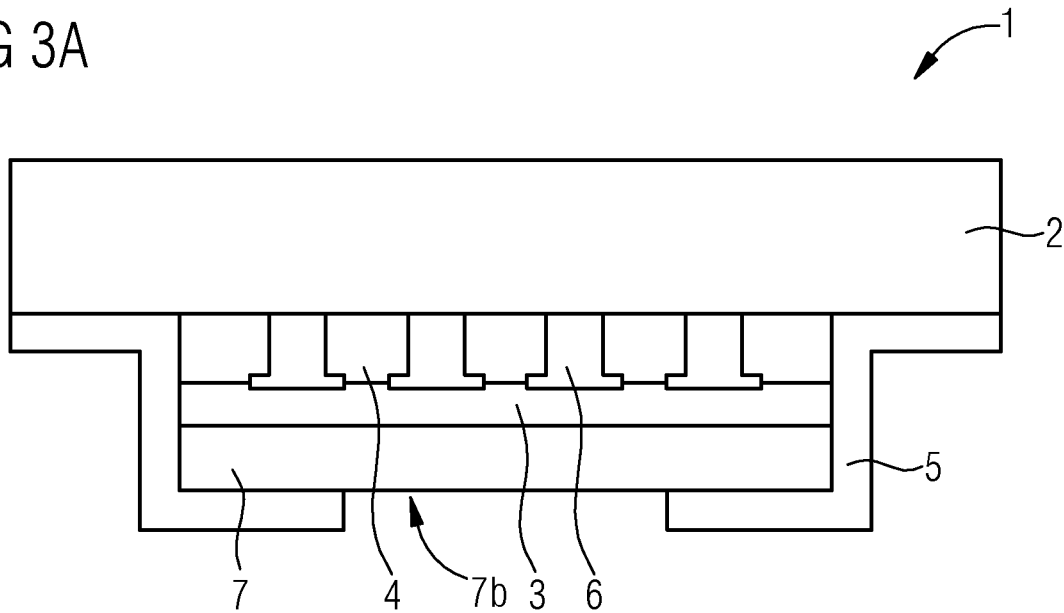

In contrast to the exemplary embodiment of FIG. 2, according to FIG. 3A the seal 5 on the underside of the support layer is punctured in places and the supporting layer 7 is exposed. The seal 5 here is designed to be electrically insulating. This means that at the points where the supporting layer 7 is free of the seal 5, an electrical contact can be established with the supporting layer 7 and the reflector 3, for example.

Figure 3B:
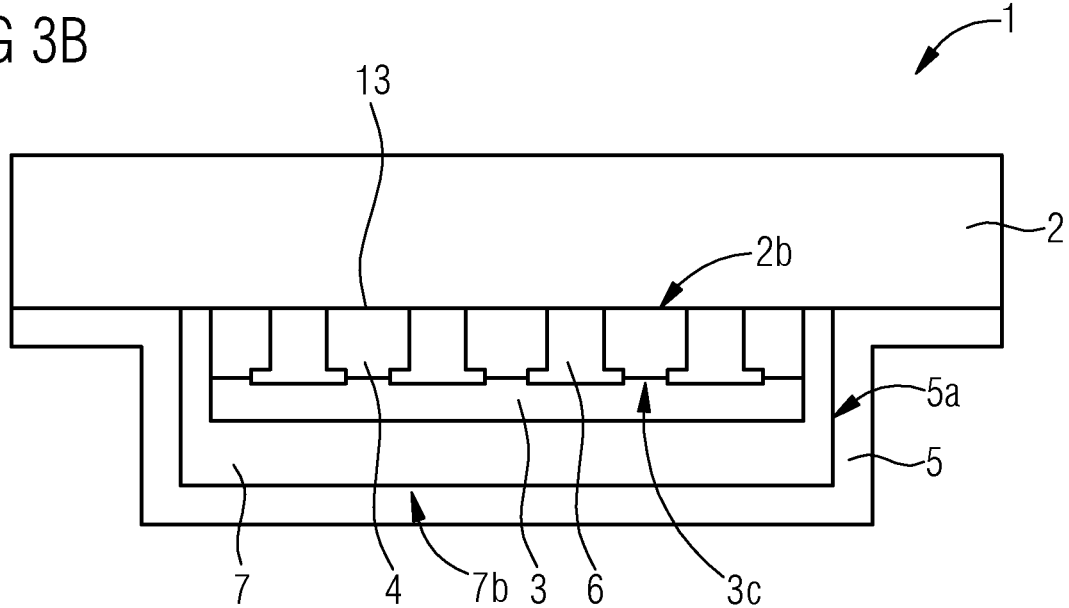

In contrast to the exemplary embodiment of FIG. 2, according to FIG. 3B an intermediate layer 13 is arranged between the columns 6 and the semiconductor body 2. In addition, the supporting layer 7 covers a side face of the seal 5a that faces toward the reflector 3. The supporting layer 7 here is in direct contact with the semiconductor body 2. The intermediate layer 13 can cover the underside of the semiconductor body 2b, which is not covered by the seal 5 and the supporting layer 7. Alternatively, it is possible that the intermediate layer 13 completely covers the underside of the semiconductor body 2b and is also arranged between the seal 5 and the supporting layer 7 and the semiconductor body 2.

Figure 3C:
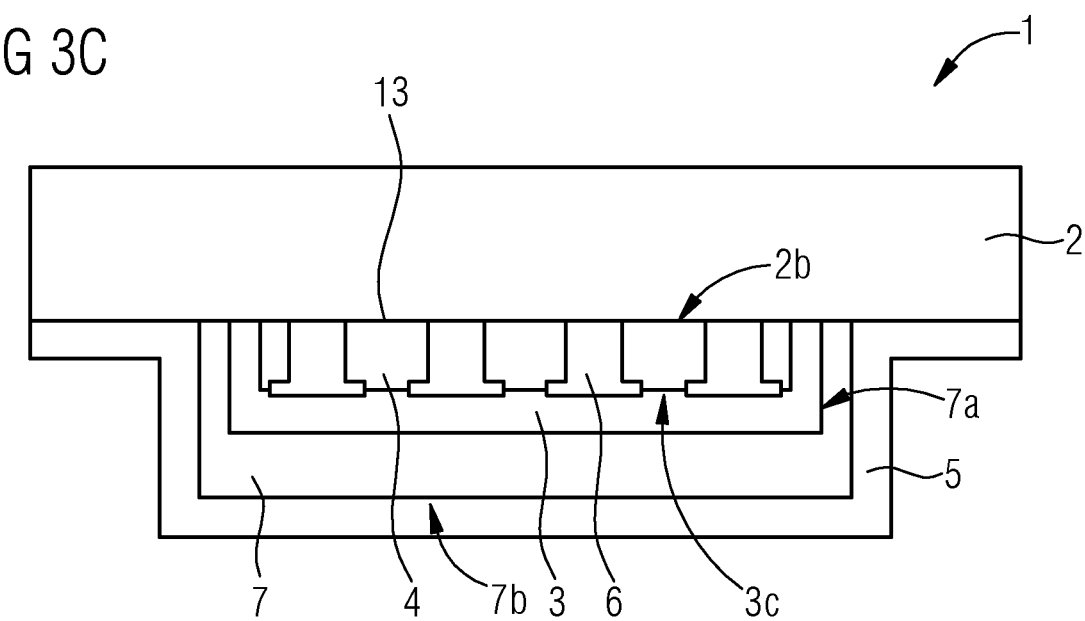

In contrast to the exemplary embodiment of FIG. 3B, according to FIG. 3C the reflector 3 covers a side face of the supporting layer 7a that faces toward the columns 6. In addition, the reflector 3 is in direct contact with the semiconductor body 2.

Figure 3D:
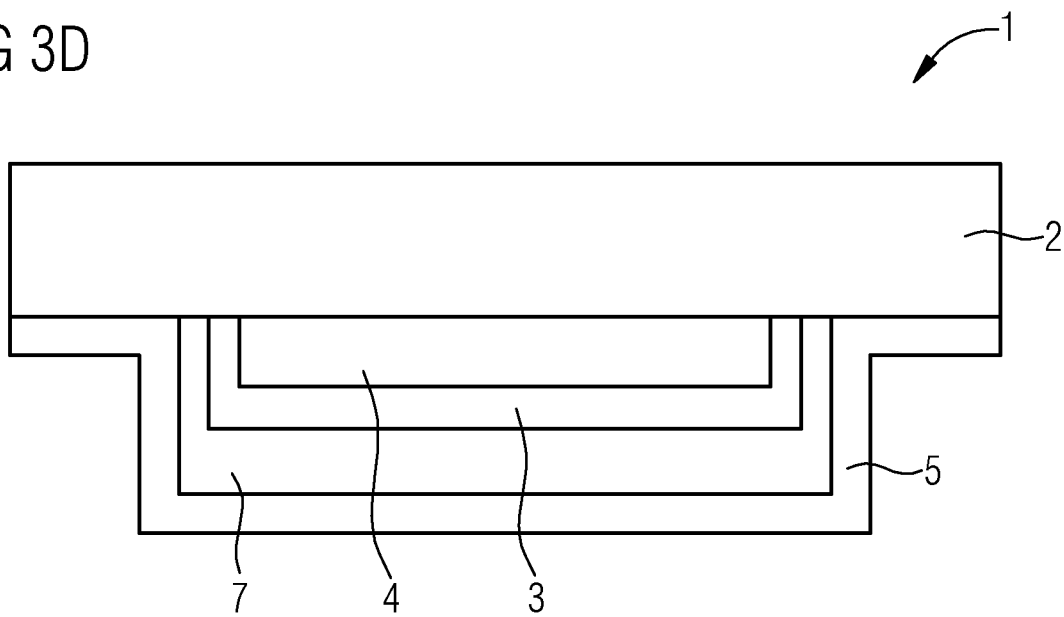

In contrast to the exemplary embodiment of FIG. 3C, according to FIG. 3D, there are no columns and no intermediate layer 13 arranged between the semiconductor body and the reflector 3. The mechanical stability is imparted here by the reflector 3 and the supporting layer 7, which are in direct contact with the semiconductor body. For example, the reflector 3 and the supporting layer 7 here impart a gap between the semiconductor body 2 and the reflector 3, thus defining the vertical extension of the cavity 4.

The schematic cross-sectional drawings in plan view of FIGS. 4A to 4H show further exemplary embodiments of a radiation-emitting semiconductor chip 1 described here. In each case an arrangement of the supports 6 on the semiconductor body 2 is shown.

Figure 4A:
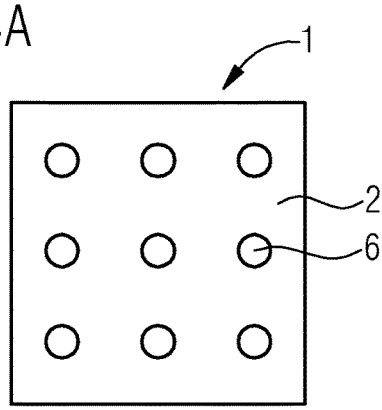
FIGS. 4A, 4B, 4C, 4D, 4E, 4F, 4G and 4H show schematic cross-sectional plan views of exemplary embodiments of a radiation-emitting semiconductor chip described here.
Figure 4B:
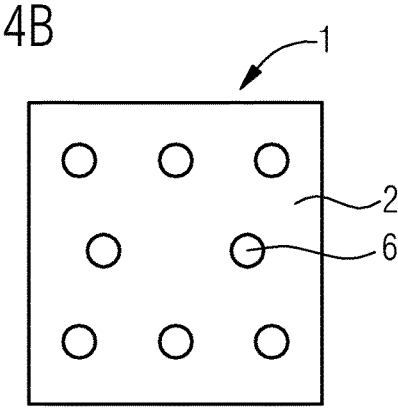

According to FIG. 4A, the supports 6 are arranged at grid points of a regular grid, which extends along a lateral plane parallel to the main extension plane of the semiconductor body 2. In addition, the supports 6 can be arranged at grid points of an irregular grid, shown in FIG. 4B.

Figure 4C:
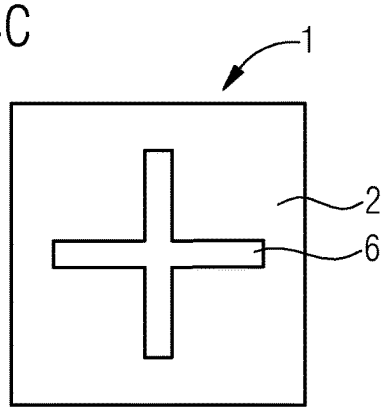
Figure 4D:
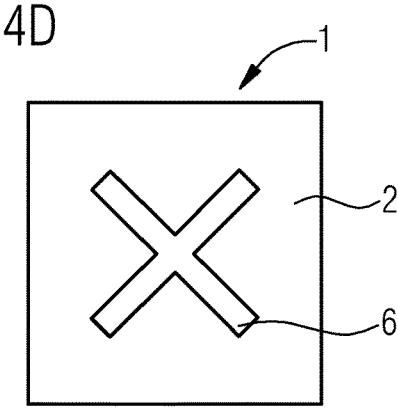

According to FIGS. 4C and 4D, the supports 6 are formed as tracks that overlap.

Figure 4E:
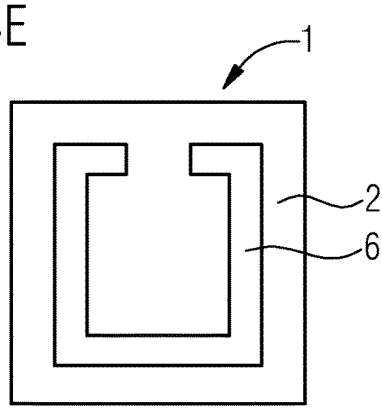
Figure 4F:
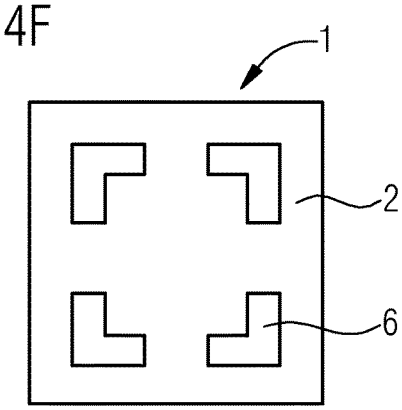
Figure 4G:
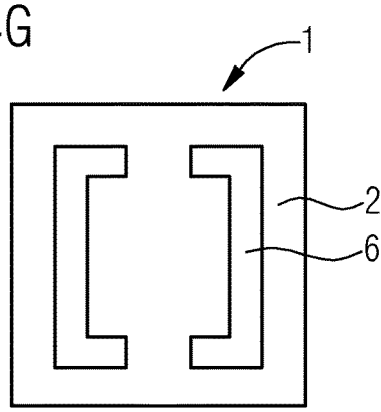

According to FIGS. 4E, 4F and 4G, the support 6 is designed as a closed track with discontinuities. This means that in the lateral plane the support has a frame-shaped course, which is discontinuous in places.

Figure 4H:
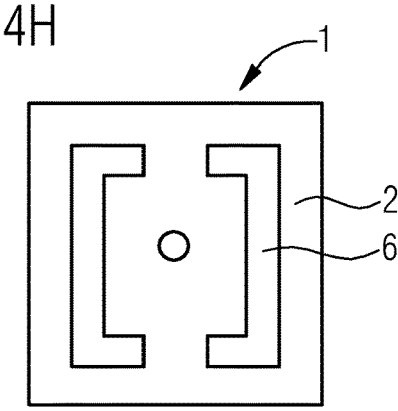

According to FIG. 4H, the supports are formed from a closed track that has discontinuities and the shape of a column or post.

In conjunction with FIGS. 5A to 5F, an exemplary embodiment is shown of a production method for radiation-emitting semiconductor chips 1 described here.

Figure 5A:
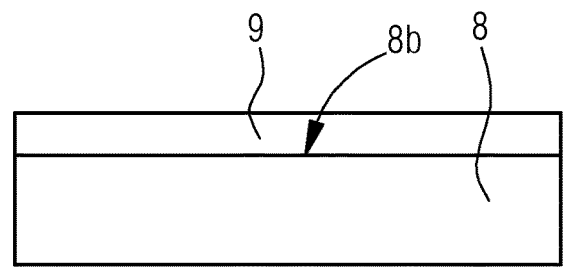
FIGS. 5A, 5B, 5C, 5D, 5E and 5F show schematic cross-sectional views of processing steps of an exemplary embodiment of a method for producing a radiation-emitting semiconductor as described here.

According to FIG. 5A, in a first process step a semiconductor wafer 8 is provided. A sacrificial layer 9, which consists of or is made of silicon dioxide, for example, is applied to the underside of the semiconductor wafer 8b. The sacrificial layer 9 here is in direct and immediate contact with the semiconductor wafer 8.

Figure 5B:
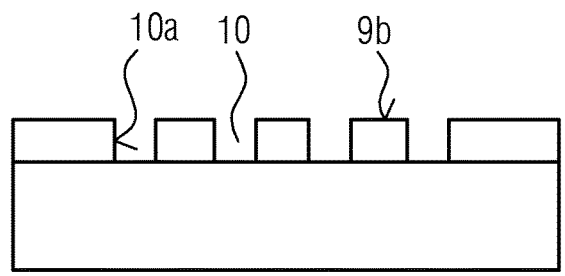

According to FIG. 5B, in a following process step, a plurality of openings 10 is produced in the sacrificial layer 9. The material removal here is generated, for example, by local etching from the underside of the sacrificial layer 9b. The openings 10 in this case completely penetrate the sacrificial layer 9. For example, the openings 10 can be arranged at grid points of a regular grid. Alternatively, it is possible to implement each of the openings as a closed path.

In the area of the openings, the semiconductor wafer 8 is exposed. This means that the base surface of the openings 10 is formed by the underside of the semiconductor wafer 8b. The side faces of the openings 10a are formed by the sacrificial layer 9.

Figure 5C:
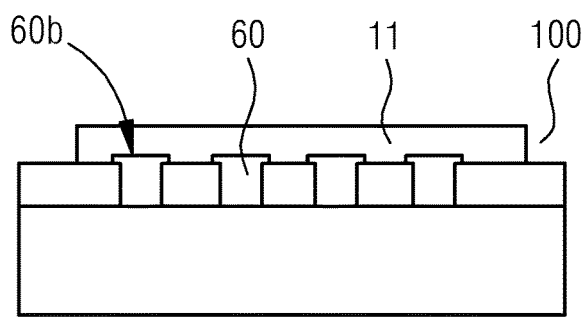

In accordance with FIG. 5C, in a following process step the openings 10 are filled with a support material 60. The openings 10 are completely filled with the support material 60. The support material 60 can protrude past the underside of the sacrificial layer 9b. In addition, the support material 60 can protrude from the sides of the openings 10.

Furthermore, a reflector layer 11 is created on the underside of the sacrificial layer 9b and the underside of the support material 60b. The reflector layer 11 is in direct and immediate contact with the underside of the sacrificial layer 9b and the underside of the support material 60b.

After applying the reflector layer 11, it is possible to structure the reflector layer 11. For example, when applying the reflector layer 11 a plurality of cutouts 100 can be produced in the reflector layer 11. The reflector layer 11 in this case is in direct and immediate contact with the underside of the sacrificial layer 9b and with the supports 6. A base surface of the cutouts 100 is formed by the underside of the sacrificial layer 9b. The side faces of the cutouts 100 are formed by the reflector layer 11.

Alternatively, after applying the reflector layer 11, it is possible to create a plurality of openings 100 in the reflector layer 11. The openings 100 in the reflector layer 11 can be created, for example, by material abrasion of the reflector layer 11. The material abrasion can be carried out, for example, by etching. The openings 100 then completely penetrate the reflector layer 11. This means that the reflector layer 11 is then completely removed and punctured by the opening 100. The underside of the semiconductor wafer 8b then forms a base surface of the opening 100.

Figure 5D:
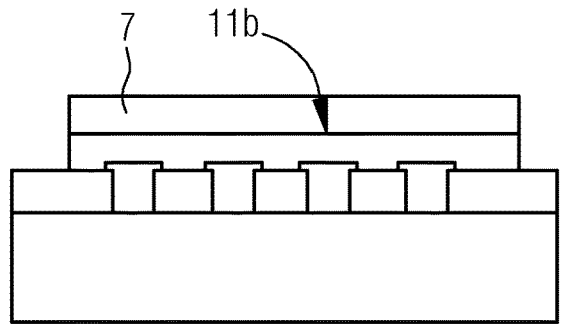

According to FIG. 5D, in the following process step a supporting layer 7 is applied to an outer side of the reflector layer 11 facing away from the semiconductor wafer 8. In this case, for example, the supporting layer 7 terminates flush with the reflector layer 11 laterally. The supporting layer 7 is in direct and immediate contact with the underside of the reflector layer 11b.

Figure 5E:
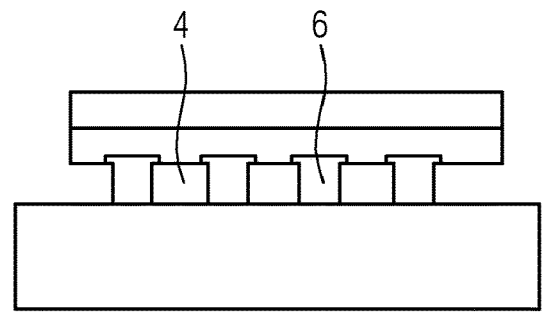

According to FIG. 5E, the sacrificial layer 9 is removed in a following process step. The sacrificial layer 9, which consists of silicon dioxide, for example, is removed by means of a hydrofluoric acid etching process, for example. This creates at least one cavity 4 between the semiconductor body 2 and the reflector layer 11.

Figure 5F:
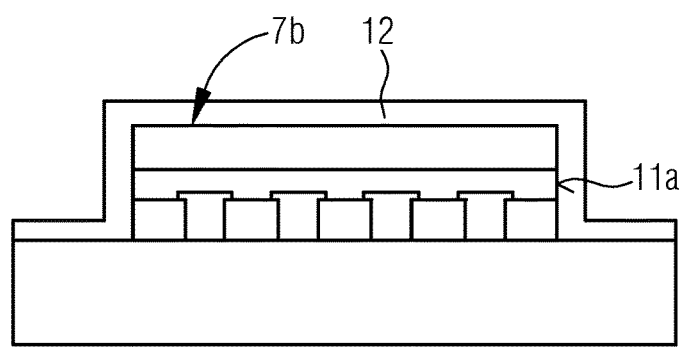

According to FIG. 5F, in a following process step a sealing layer 12 is applied to an outer side facing away from the semiconductor wafer 8. The sealing layer 12 completely encloses the at least one cavity 4 laterally. For example, the sealing layer 12 allows a material to be introduced into the at least one cavity 4 with a pressure which is lower than the normal external pressure. A material introduced with a positive pressure improves the thermal properties of the material in the at least one cavity 4. This means that in this case, the heat dissipation through the material in the at least one cavity 4 is further improved.

In addition, the sealing layer 12 completely covers the underside of the supporting layer 7b and the side faces of the reflector layer 11a. The sealing layer 12 protects the supporting layer 7 and the reflector layer 11 from chemical damage, for example.

Figure 6:
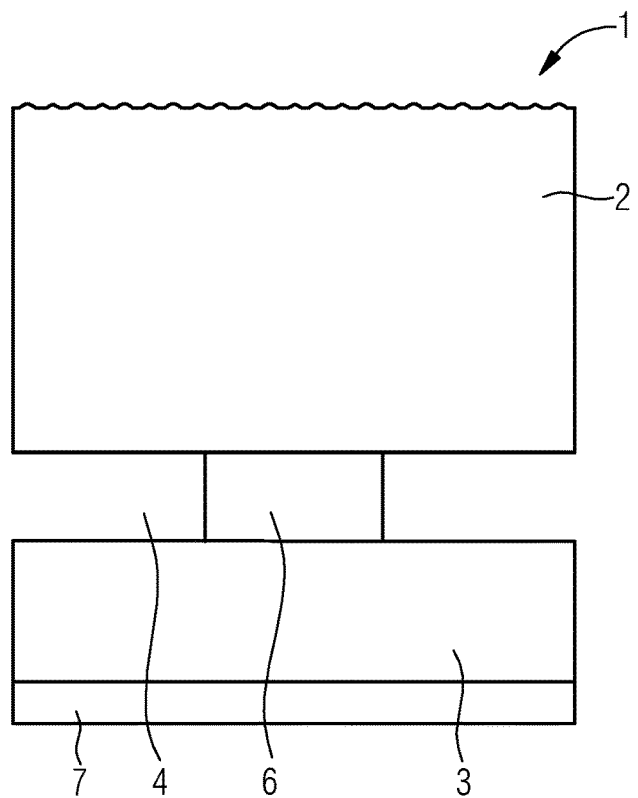
FIG. 6 shows a schematic cross-sectional view of an exemplary embodiment of a radiation-emitting semiconductor chip described here.

The schematic cross-sectional drawing of FIG. 6 shows a further exemplary embodiment of a radiation-emitting semiconductor chip described here that can be produced using a method described here. Similarly to the exemplary embodiment of FIGS. 1 and 2, the radiation-emitting semiconductor chip 1 comprises a semiconductor body 2, which comprises an active region, for example.

The semiconductor body 2 and the reflector 3 are connected to each other mechanically and/or in an electrically conductive manner by means of at least one support 6, for example. The at least one support 6 creates a gap between the semiconductor body 2 and the reflector 3. Due to this gap, at least one cavity 4 is formed between the semiconductor body 2 and the reflector 3. The at least one cavity 4 is filled with air. Here, no seal 5 is arranged and the at least one cavity 4 is not sealed. For example, this radiation-emitting semiconductor chip 1 can be installed in a component.

This patent application claims the priority of the German patent application 10 2018 101 389.2, the disclosed content of which is hereby incorporated by reference.

The invention is not limited to the embodiments by the fact that the description is based on them. Rather, the invention comprises each new feature, as well as any combination of features, which includes in particular every combination of features in the patent claims, even if this feature or this combination itself is not explicitly specified in the patent claims or exemplary embodiments.

LIST OF REFERENCE SIGNS 1 radiation-emitting semiconductor chip
2 semiconductor body
2b underside of semiconductor body
3 reflector
3a side face of reflector
3b underside of reflector
3c upper side of reflector
4 cavity
5 seal
5a side face of reflector
5b underside of seal
6 supports
60 support material
60b underside of support material
7 supporting layer
7a side face of supporting layer
7b underside of supporting layer
8 semiconductor wafer
8b underside of semiconductor wafer
9 sacrificial layer
9b underside of sacrificial layer
10 openings
10a side faces of openings
100 additional openings and cutouts
11 reflector layer
11a side face of reflector layer
11b underside of reflector layer
12 sealing layer
13 intermediate layer

The invention claimed is:

1. A radiation-emitting semiconductor chip comprising:
a semiconductor body comprising an active region configured to generate electromagnetic radiation;
a reflector configured to reflect a portion of the electromagnetic radiation; wherein the semiconductor body extends beyond the reflector in a lateral direction;
at least one cavity;
a supporting layer arranged on an underside of the reflector facing away from the semiconductor body; wherein the supporting layer comprises a top side, a bottom side opposite the top side, and two sidewalls adjacent to the top side and the bottom side; wherein the top side faces the underside of the reflector;
at least one support arranged between the reflector and the semiconductor body; wherein the at least one support is a metal material or a transparent conductive oxide; and wherein when the at least one support is a metal material, then the reflector has the same material as the at least one support; and
a seal impermeable to the material;
wherein the at least one cavity is arranged between the reflector and the semiconductor body, wherein the seal covers the underside of the reflector, wherein the seal contacts a portion of the semiconductor body that extends beyond the reflector in the lateral direction; and wherein the seal laterally surrounds the supporting layer and at least partially covers at least one side wall of the supporting layer, wherein the at least one support imparts the at least one cavity as a singular gap absent of solid material and located between the semiconductor body and the reflector, and wherein the support comprises columns or posts situated within the singular gap.

2. The radiation-emitting semiconductor chip as claimed in claim 1, wherein:
the seal completely laterally surrounds the at least one cavity, and
the seal at least partially covers one side face of the reflector.

3. The radiation-emitting semiconductor chip as claimed in claim 2, wherein the seal terminates flush with a portion of the semiconductor body that extends beyond the reflector in the lateral direction.

4. The radiation-emitting semiconductor chip as claimed in claim 1, wherein the seal completely laterally surrounds the sidewalls of the supporting layer, the reflector, and the at least one cavity.

5. The radiation-emitting semiconductor chip of claim 1, wherein the at least one support forms an electrically conductive and mechanical connection between the reflector and the semiconductor body.

6. The radiation-emitting semiconductor chip as claimed in claim 1, wherein the at least one support is in direct contact with the reflector and the semiconductor body.

7. The radiation-emitting semiconductor chip as claimed in claim 1, wherein an intermediate layer is arranged between the semiconductor body and the at least one support.

8. A method for producing a radiation-emitting semiconductor chip,
wherein the method comprises:
providing a semiconductor wafer comprising a plurality of semiconductor bodies;
applying a structured sacrificial layer on an underside of the semiconductor wafer;
producing a plurality of openings in the sacrificial layer;
filling the plurality of openings with a support material that is a metal material or a transparent conductive oxide to form supports;
applying a reflector layer on an outer side of the sacrificial layer and an outer side of the support material facing away from the semiconductor wafer; wherein the semiconductor wafer extends beyond the reflector layer in a lateral direction; wherein at least one cavity is arranged between the reflector and the semiconductor body; wherein when the at least one support of the supports is a metal material, then the reflector has the same material as the support material;
removing the sacrificial layer;
applying a supporting layer on an underside of the reflector facing away from the semiconductor body; wherein the supporting layer comprises a top side, a bottom side opposite the top side, and two sidewalls adjacent to the top side and the bottom side; wherein the top side faces the underside of the reflector;
applying a sealing layer on an outer side facing away from the semiconductor wafer, wherein the sealing layer is impermeable to the support material; wherein the sealing layer contacts a portion of the semiconductor wafer that extends beyond the reflector layer in the lateral direction; wherein the seal laterally surrounds the supporting layer and at least partially covers at least one side wall of the supporting layer; and
separating a plurality of semiconductor chips,
wherein the at least one support imparts the at least one cavity as a singular gap absent of solid material and located between the semiconductor body and the reflector, and wherein the support comprises columns or posts situated within the singular gap.

9. The method as claimed in claim 8, further comprising wherein producing openings in the sacrificial layer occurs after applying the structured sacrificial layer, wherein the semiconductor wafer is exposed in the area of the openings, and wherein the reflector layer covers the supports.

10. The method as claimed in claim 8, wherein the separating occurs through the sealing layer and the semiconductor body.

11. The method as claimed in claim 8, the separating occurs through the supporting layer and/or the sealing layer and the semiconductor body.

12. The radiation-emitting semiconductor chip as claimed in claim 1, further comprising filling the at least one cavity with a gas is selected from the group consisting of argon, krypton, xenon, oxygen, $SF_6$, $H_2O$, and mixtures thereof.

13. The method as claimed in claim 8, further comprising filling the at least one cavity with a gas is selected from the group consisting of argon, krypton, xenon, oxygen, $SF_6$, $H_2O$, and mixtures thereof.

14. The radiation-emitting semiconductor chip as claimed in claim 1, wherein the reflector comprises a top side, a bottom side opposite the top side, and two sidewalls adjacent to the top side and the bottom side, wherein the supporting layer laterally surrounds the reflector and at least partially covers at least one side wall of the reflector.

15. The method as claimed in claim 8, wherein the reflector layer comprises a top side, a bottom side opposite the top side, and two sidewalls adjacent to the top side and the bottom side, wherein the supporting layer is applied in a manner to laterally surround the reflector and at least partially cover at least one side wall of the reflector.

16. The radiation-emitting semiconductor chip as claimed in claim 1, wherein the at least one cavity is filled with a material having a refractive index not exceeding 1.1.

17. The method as claimed in claim 8, wherein the at least one cavity is filled with a material having a refractive index not exceeding 1.1.

18. The radiation-emitting semiconductor chip as claimed in claim 1, wherein the metal material of the at least one support consists of aluminum, silver, or gold.

19. The method as claimed in claim 8, wherein the metal material of the support material consists of aluminum, silver, or gold.

\* \* \* \* \*